United States Patent [19]
Goudie

[11] Patent Number: 6,016,089
[45] Date of Patent: Jan. 18, 2000

[54] PRINTED CIRCUIT WITH RESILIENT CONTACTS PROVIDING A GROUND PATH FOR COMMON-MODE FILTRATION CAPACITORS

[75] Inventor: Stephen John Goudie, Solihull, United Kingdom

[73] Assignee: Lucas Industries, Solihull, United Kingdom

[21] Appl. No.: 08/992,326

[22] Filed: Dec. 17, 1997

[30] Foreign Application Priority Data

Dec. 21, 1996 [GB] United Kingdom .................. 9626640

[51] Int. Cl.[7] ........................................... H03H 7/01
[52] U.S. Cl. .......................... 333/181; 333/12; 333/183; 439/620; 361/752
[58] Field of Search .................... 333/181–185, 333/12; 361/752; 439/620

[56] References Cited

U.S. PATENT DOCUMENTS 4,992,061  2/1991  Brush, Jr. et al. ................... 439/620

FOREIGN PATENT DOCUMENTS 1-109811  4/1989  Japan ..................................... 333/181

*Primary Examiner*—Justin P. Bettendorf
*Attorney, Agent, or Firm*—Wells, St. John, Roberts, Gregory & Matkin, P.S.

[57] ABSTRACT

A printed circuit device comprising a printed circuit board carrying capacitors connected in use as common mode filters, a casing component supporting the printed circuit board and electrically grounded in use, and, a plurality of electrically conductive resilient contact elements resiliently engaging said casing component so as to make electrical connection thereto, each of said contact elements being physically secured to the printed circuit board and providing a ground path for a respective common mode filtration capacitor.

9 Claims, 2 Drawing Sheets

PRINTED CIRCUIT WITH RESILIENT CONTACTS PROVIDING A GROUND PATH FOR COMMON-MODE FILTRATION CAPACITORS

TECHNICAL FIELD

This invention relates to a printed circuit device comprising a printed circuit board and a casing component supporting the printed circuit board, the printed circuit board incorporating electro-magnetic compatibility (EMC) filters for removing high frequency noise currents from power lines of the device.

BACKGROUND OF THE INVENTION

It is known in such devices to provide the EMC filtration by means of common mode filters the capacitors of which are grounded by way of a common ground plane of the printed circuit board of the device, but such an arrangement has been found to create an impedance network linking the capacitors to the detriment of the EMC filtration. It is an object of the present invention to produce a printed circuit device of the kind specified in which the aforementioned disadvantage is minimised.

SUMMARY OF THE INVENTION

In accordance with the present invention there is provided a printed circuit device having a printed circuit board carrying capacitors connected in use as common mode filters, a casing component supporting the printed circuit board and electrically grounded in use, and, a plurality of electrically conductive resilient contact elements resiliently engaging said casing component so as to make electrical connection thereto, each of said contact elements being physically secured to the printed circuit board and providing a ground path for a respective common mode filtration capacitor.

Preferably said elements include securing regions extending in respective apertures of the printed circuit board and making electrical contact with their respective capacitor by way of a track of the printed circuit board.

Desirably said track connecting each element with each respective capacitor is a buried track in a multi-layer printed circuit board.

Conveniently the capacitors of the common mode filters are arranged in pairs each capacitor of the pair having one terminal connected to a respective line of the device, and the other terminal connected to a common contact element, so that each contact element provides a ground path for the two capacitors of the respective filter.

Preferably the printed circuit board includes a heat plane in the form of an electrically and thermally conductive layer for distributing heat generated in the device by conduction to said casing component, said heat plane being electrically and thermally connected to said casing component other than through said contact elements.

It will be understood that electrical separation of the heat plane from said contact elements ensures that any noise current generated in the heat plane, for example by proximity to noise generating components on the board, is grounded directly to the casing component without influencing the EMC filtration.

DETAILED DESCRIPTION OF THE PREFERRED EMBODIMENTS

Figure 1:
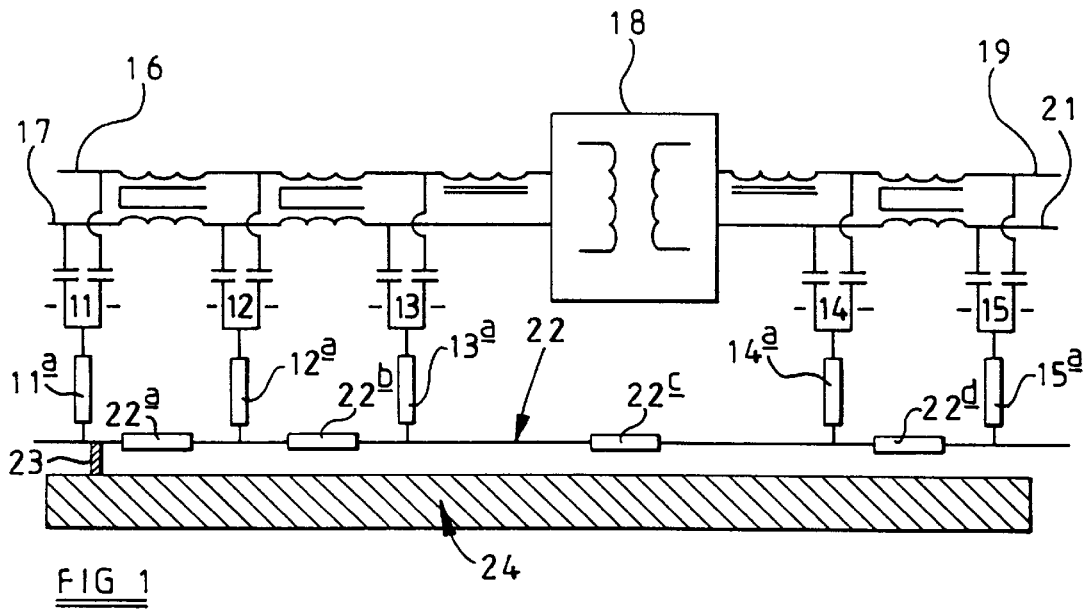
FIG. 1 is a circuit diagram illustrating a known printed circuit device.

Referring first to FIG. 1 of the drawings there is illustrated part of the circuit of a printed circuit device which may, for example, be a switch mode power supply. The part of the circuit illustrated in FIG. 1 depicts electro-magnetic compatibility (EMC) filters 11, 12, 13, 14 and 15 acting as common mode filters, the filters 11, 12 and 13 being arranged to operate in conjunction with common mode impedance in series with the input lines 16, 17 of a converter 18 to remove unwanted high frequency noise current from the input lines, while the filters 14, 15 operate similarly to remove high frequency noise current from the output lines 19, 21 of the converter 18. Each of the filters 11–15 comprises first and second capacitors each having one terminal connected to a respective line and the other terminal connected through an undesirable series impedance (indicated by the suffix a in the drawings) defined by the connection to a common ground plane 22 of the printed circuit board of the device. The ground plane 22 is a continuous, or substantially continuous conductive layer on the printed circuit board, or more usually, where the printed circuit board is a multi-layer board, the ground plane is a buried layer within the multi-layer board. A single electrical connection 23 is made between the ground plane 22 and the casing 24 of the device which is electrically grounded in use.

It has been found that those regions of the ground plane 22 between its points of interconnection with the filters 11–15, and also between the points of interconnection and the connector 23, define further impedances (shown diagrammatically in FIG. 1 as 22a, 22b, 22c and 22d respectively) creating an impedance network linking the capacitors of the filters 11–15 to the detriment of the performance of the EMC filtration. It is found that the ground network impedance so produced has the effect of by-passing at least some of the common mode stages of the EMC filtration. The noise current from one filter will generate a corresponding voltage across the impedance network and this voltage will in turn be coupled back to the lines by way of one or more of the other filters.

Although not illustrated in FIG. 1 it is known for the ground connection 23 to be made through a heat plane of the printed circuit board. The heat plane is a thermally and electrically conductive layer forming part of, or closely associated with, the printed circuit board and serving to distribute heat generated by the device more evenly over the device. More specifically, the heat plane is used to distribute heat by conduction to the casing 24, and also by radiation. However, the heat plane inevitably passes in close proximity to devices on the printed circuit board which may themselves generate high frequency noise current in the heat plane. Thus the heat plane itself may be a source of noise currents having a further detrimental effect on the efficiency of the EMC filtration.

Figure 2:
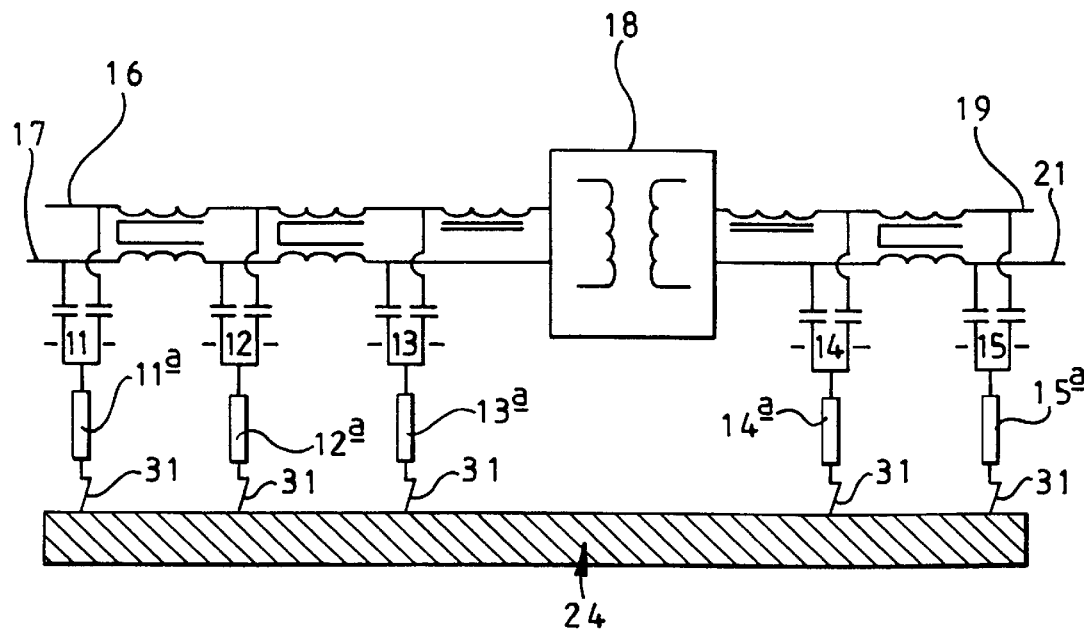
FIG. 2 is a circuit diagram of a printed circuit device in accordance with one example of the present invention.

In the example of the invention illustrated in FIG. 2 reference numerals corresponding to FIG. 1 have been used to denote the same items. It can be seen that the filters 11–15 are individually grounded directly to the casing 24, the two capacitors of each filter being connected through the common impendence of the filter and a respective connecter element 31 in series to the casing component 24.

Figure 3:
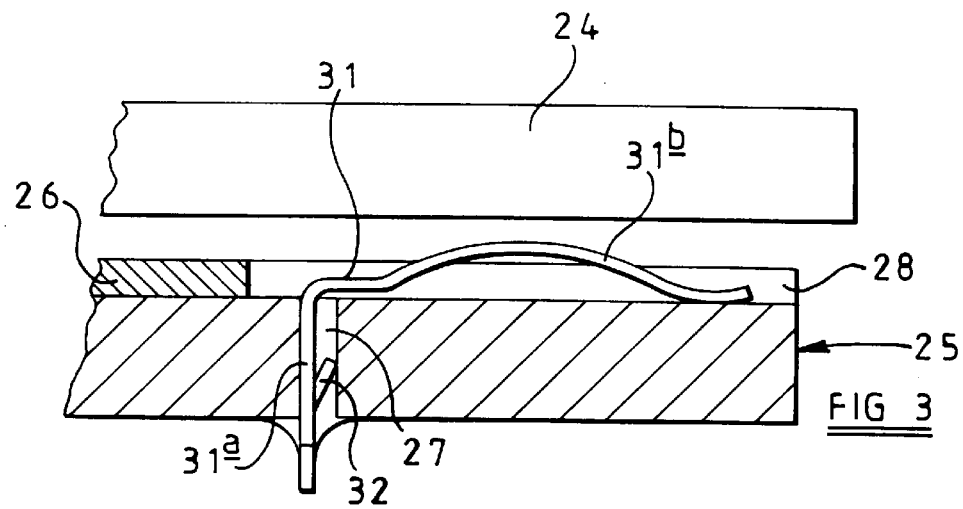
FIG. 3 is a diagrammatic cross-sectional view illustrating an electrical connection of an EMC filter of FIG. 2.
Figure 4:
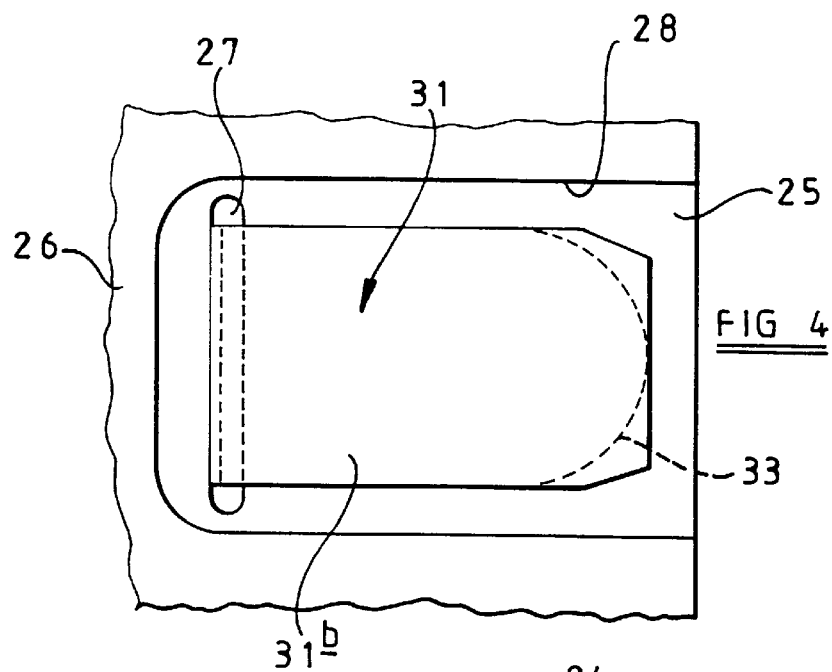
FIG. 4 is a plan view of the connection illustrated in FIG. 3.

In FIGS. 3 and 4, which illustrate a convenient form of the connector element 31, there is shown a multi-layer printed circuit board 25 of the device having a heat plane including a sheet of copper or aluminium 26 bonded to its upper surface. The copper or aluminium 26 is not electrically connected to any of the tracks of the multi-layer printed circuit board 25, and FIGS. 3 and 4 do not illustrate intermediate tracks and layers of the board. There is an intermediate layer comprising a plurality of discrete tracks each of which forms an unavoidable series impedance 11a–15a and terminates at the wall of a respective, plated through slot 27 in the board 25. A respective connector element 31 is associated with each of the slots 27, each element 31 being generally L-shaped incorporating a first limb 31a received within a respective slot 27 and soldered therein so as to make electrical connection to the respective intermediate track.

Each connector element 31 is formed from a resilient material, conveniently beryllium-copper which has been tin-lead or silver plated to facilitate the soldered connection in the slot 27. Moreover, each limb 31a has a protruding barb 32 to assist in physically locking the limb 31a in place in its respective slot 27 before soldering takes place. The other limb 31b of each element 31 extends across the upper surface of the board 25 and is bowed upwardly therefrom. In order that there shall be no electrical connection between an element 31 and the heat plane 26, the heat plane 26 is formed with appropriate cut-outs 28 around the connector elements 31. In use the board 25 is secured to the casing component 24 by screws, or clamps, such that a facial contact exists between the heat plane 26 and the casing component 24. Thus the heat plane 26 is both thermally and electrically connected to the casing 24, but in addition, by virtue of the upward bowing of the limb 31b of each connector 31 the limb 31b of each connector bears against, and is flexed downwardly by, the casing component 24. Thus each connector element 31 is electrically connected directly to the casing component 24 and is grounded in use therethrough.

It will be recognised that each EMC filter arrangement is individually grounded by a respective connector element 31, directly to the casing component 24 thereby preventing the creation of a disadvantageous impedance network linking the filters. Furthermore, the heat plane 26 is separately electrically and thermally connected to the casing component 24 by virtue of its facial contact therewith, and it will be recognised therefore that any noise current generated within the heat plane 26, for example by its presence in close proximity to noise generating components on the board 25, will not affect the EMC filtration.

The broken line 33 in FIG. 4 illustrates an alternative end shaping for the limb 31b of each connector element 31.

Figure 5:
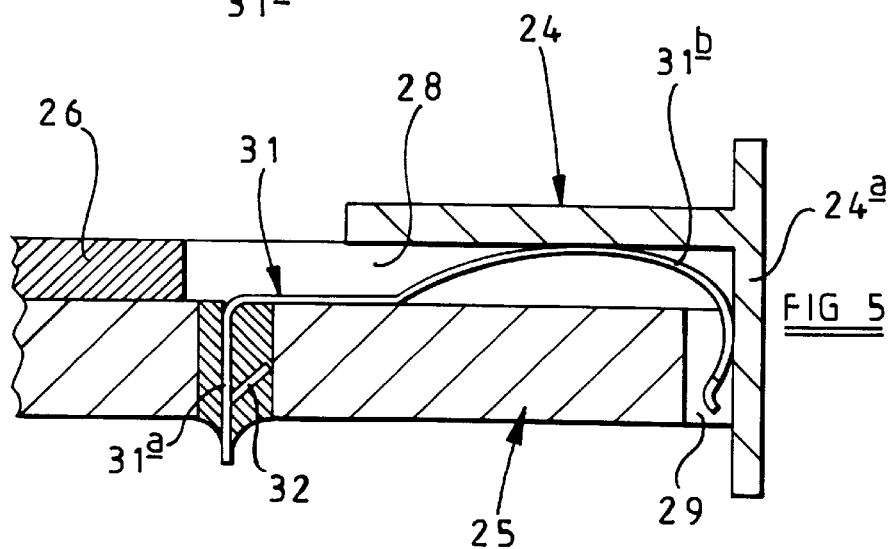
FIG. 5 is a view similar to FIG. 3 of a modification.

FIG. 5 illustrates a modification of each connector element 31 in which the limb 31b is extended around an edge of the board 25 so as simultaneously to make contact with the base and a side wall 24a of the casing component 24. It will be noted that an appropriate notch 29 is cut in the edge of the board 25 to accommodate the extended region of the limb 31b of each connector element 31. The engagement of the limbs 31b with the side wall 24a around the periphery of the printed circuit board serves to assist centralisation of the board in the casing component 24 during assembly.

It will be recognised that there may be situations in which two pairs of capacitors are positioned sufficiently closely to one another to share a single connector element 31 without any disadvantage to the efficiency of the EMC filtration. However, generally each pair of capacitors will have a respective connector element 31, the connector elements 31 being disposed around the periphery of the board 25.

I claim:

1. A printed circuit device comprising a printed circuit board carrying one or more components and associated connections, common mode filtration capacitors connected in use as common mode filters and associated with component areas of the board where said one or more components are present, a casing component supporting the printed circuit board and electrically grounded in use, and, a plurality of electrically conductive resilient contact elements resiliently engaging said casing component so as to make electrical connection thereto, each of said contact elements being physically secured to the printed circuit board and providing a ground path for at least a respective one of said common mode filtration capacitors, wherein said elements include securing regions extending in respective apertures of the printed circuit board and making electrical contact with their respective common mode filtration capacitor by way of a track of the printed circuit board.

2. A printed circuit device comprising a printed circuit board carrying common mode filtration capacitors connected in use as common mode filters, a casing component supporting the printed circuit board and electrically grounded in use, and, a plurality of electrically conductive resilient contact elements resiliently engaging said casing component so as to make electrical connection thereto, each of said contact elements being physically secured to the printed circuit board and providing a ground path for at least a respective one of said common mode filtration capacitors, wherein said elements include securing regions extending in respective apertures of the printed circuit board and making electrical contact with their respective common mode filtration capacitor by way of a track of the printed circuit board.

3. A device as claimed in claim 2, wherein said track connecting each element with each respective common mode filtration capacitor is a buried track in a multi-layer printed circuit board.

4. A device as claimed in claim 2, wherein the common mode filtration capacitors are arranged in pairs, each common mode filtration capacitor of the pair having one terminal connected to a respective line of the device, and the other terminal connected to a common contact element, so that each contact element provides a ground path for the two common mode filtration capacitors of the respective filter.

5. A printed circuit device comprising a printed circuit board carrying common mode filtration capacitors connected in use as common mode filters, a casing component supporting the printed circuit board and electrically grounded in use, and, a plurality of electrically conductive resilient contact elements resiliently engaging said casing component so as to make electrical connection thereto, each of said contact elements being physically secured to the printed circuit board and providing a ground path for at least a respective one of said common mode filtration capacitors, wherein the printed circuit board includes a heat plane in the form of an electrically and thermally conductive layer for distributing heat generated in the device by conduction to said casing component, said heat plane being electrically and thermally connected to said casing component other than through said contact elements.

6. A printed circuit device comprising a printed circuit board carrying common mode filtration capacitors connected in use as common mode filters, a casing component supporting the printed circuit board and electrically grounded in use, and, a plurality of electrically conductive resilient contact elements resiliently engaging said casing component so as to make electrical connection thereto, each of said contact elements being physically secured to the printed circuit board and providing a ground path for at least a respective one of said common mode filtration capacitors, wherein the common mode filtration capacitors are arranged in pairs, each common mode filtration capacitor of the pair having one terminal connected to a respective line of the device, and the other terminal connected to a common contact element, so that each contact element provides a ground path for the two common mode filtration capacitors of the respective filter, wherein the printed circuit board includes a heat plane in the form of an electrically and thermally conductive layer for distributing heat generated in the device by conduction to said casing component, said heat plane being electrically and thermally connected to said casing component other than through said contact elements.

7. A printed circuit device comprising a multi-layer printed circuit board carrying common mode filtration capacitors connected in use as common mode filters, a casing component supporting the printed circuit board and electrically grounded in use, and, a plurality of electrically conductive resilient contact elements resiliently engaging said casing component so as to make electrical connection thereto, said contact elements including securing regions extending in respective apertures of the printed circuit board and making electrical contact with at least a respective one of said common mode filtration capacitors by way of a buried track of the printed circuit board to provide a ground path for the respective one of said common mode filtration capacitors.

8. A device as claimed in claim 7, wherein the capacitors of the common mode filters are arranged in pairs each capacitor of the pair having one terminal connected to a respective line of the device, and the other terminal connected to a common contact element, so that each contact element provides a ground path for the two capacitors of the respective filter.

9. A device as claimed in claim 8, wherein the printed circuit board includes a heat plane in the form of an electrically and thermally conductive layer for distributing heat generated in the device by conduction to said casing component, said heat plane being electrically and thermally connected to said casing component other than through said contact elements.

* * * * *